United States Patent
Kim et al.

(10) Patent No.: US 9,887,382 B2
(45) Date of Patent: Feb. 6, 2018

(54) THERMOSETTING COMPOSITION FOR ORGANIC LIGHT-EMITTING ELEMENT FILLER AND ORGANIC LIGHT-EMITTING ELEMENT DISPLAY DEVICE COMPRISING SAME

(71) Applicant: CHEIL INDUSTRIES INC., Gumi-si, Gyeongsangbuk-do (KR)

(72) Inventors: Mi Sun Kim, Uiwang-si (KR); Taek Jin Baek, Uiwang-si (KR); Gyu Seok Song, Uiwang-si (KR); In Jae Song, Uiwang-si (KR); Jin Ah Lee, Uiwang-si (KR); Seung Jib Choi, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 224 days.

(21) Appl. No.: 14/769,291

(22) PCT Filed: Dec. 27, 2013

(86) PCT No.: PCT/KR2013/012293
§ 371 (c)(1),
(2) Date: Aug. 20, 2015

(87) PCT Pub. No.: WO2014/157815
PCT Pub. Date: Oct. 2, 2014

(65) Prior Publication Data
US 2016/0005995 A1    Jan. 7, 2016

(30) Foreign Application Priority Data

Mar. 26, 2013 (KR) .................. 10-2013-0032415

(51) Int. Cl.
*H01L 51/52* (2006.01)
*C08K 5/3445* (2006.01)
(Continued)

(52) U.S. Cl.
CPC ...... *H01L 51/5246* (2013.01); *C08G 59/5073* (2013.01); *C08K 5/3445* (2013.01);
(Continued)

(58) Field of Classification Search
CPC .................................................. H01L 51/5246
See application file for complete search history.

(56) References Cited

U.S. PATENT DOCUMENTS

2003/0003305 A1* 1/2003 Japp .................. B32B 15/08
428/413
2005/0208296 A1* 9/2005 Saiki ................. C09J 7/0242
428/343
(Continued)

FOREIGN PATENT DOCUMENTS

CN    1293218 A    5/2001
CN    101243117 A    8/2008
(Continued)

OTHER PUBLICATIONS

International Search Report from PCT/KR2013/2012293.
Chinese Office Action dated Jun. 30, 2016 in Corresponding Chinese Patent Application No. 201380073916.3.

*Primary Examiner* — Megan McCulley
(74) *Attorney, Agent, or Firm* — Lee & Morse, P.C.

(57) ABSTRACT

The present invention relates to a thermosetting composition for an organic light-emitting element filler, which comprises (A) 100 parts by weight of an epoxy-based resin including (A1) an epoxy resin having a weight average molecular weight of around about 200 g/mol or more to less than about 1000 g/mol, (A2) an epoxy resin having a weight average molecular weight of around about 1000 g/mol or more to less than about 20000 g/mol and (A3) an epoxy resin having a weight average molecular weight of about 20000 g/mol or more to less than about 100000 g/mol, (B) about 10 parts by weight to about 40 parts by weight of a sheet-like filler and (C) about 0.1 parts by weight to about 20 parts by weight of
(Continued)

an imidazole curing agent having a cyano group; and an organic light-emitting element display device comprising the same.

14 Claims, 17 Drawing Sheets

(51) Int. Cl.
    *C08L 63/00*     (2006.01)
    *H01L 51/00*     (2006.01)
    *C08G 59/50*     (2006.01)
    *C08K 7/02*     (2006.01)

(52) U.S. Cl.
    CPC ................ *C08K 7/02* (2013.01); *C08L 63/00* (2013.01); *H01L 51/0035* (2013.01); *C08L 2205/025* (2013.01); *C08L 2205/03* (2013.01)

(56) References Cited

U.S. PATENT DOCUMENTS

| | | | | |
|---|---|---|---|---|
| 2007/0142498 A1* | 6/2007 | Brennan | ............. | A61K 6/0023 523/118 |
| 2008/0241995 A1* | 10/2008 | Fukui | ................... | C08G 59/08 438/109 |
| 2009/0243065 A1* | 10/2009 | Sugino | .................... | H01L 23/16 257/686 |
| 2011/0024172 A1* | 2/2011 | Maruyama | ........ | H01L 23/49822 174/258 |
| 2012/0115382 A1* | 5/2012 | Contrada | .................. | H01F 1/37 442/180 |
| 2015/0060836 A1* | 3/2015 | Shim | ...................... | H05B 33/04 257/40 |
| 2016/0108526 A1* | 4/2016 | Kosydar | .................. | C23C 18/31 427/108 |

FOREIGN PATENT DOCUMENTS

| | | |
|---|---|---|
| CN | 101906236 A | 12/2010 |
| JP | 2011-068772 A | 4/2011 |
| KR | 10-2008-0065582 A | 7/2008 |
| KR | 10-2012-0113471 A | 10/2012 |
| WO | WO 2012/021258 A1 | 2/2012 |
| WO | WO 2012/138029 A1 | 10/2012 |

* cited by examiner

[FIG.1]
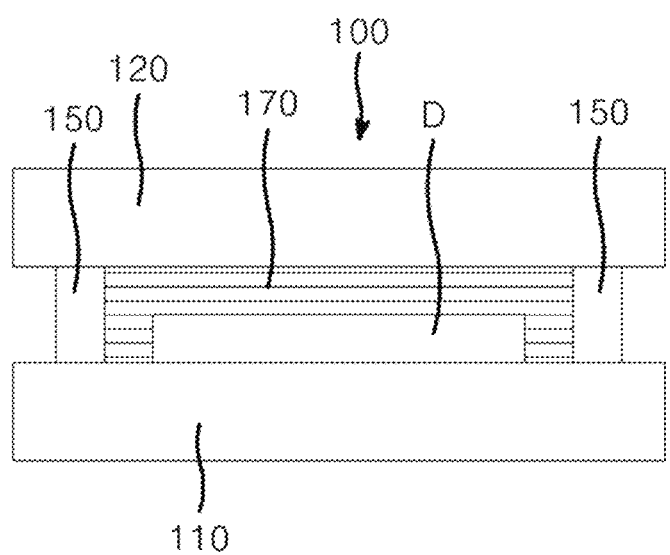

[FIG.2]
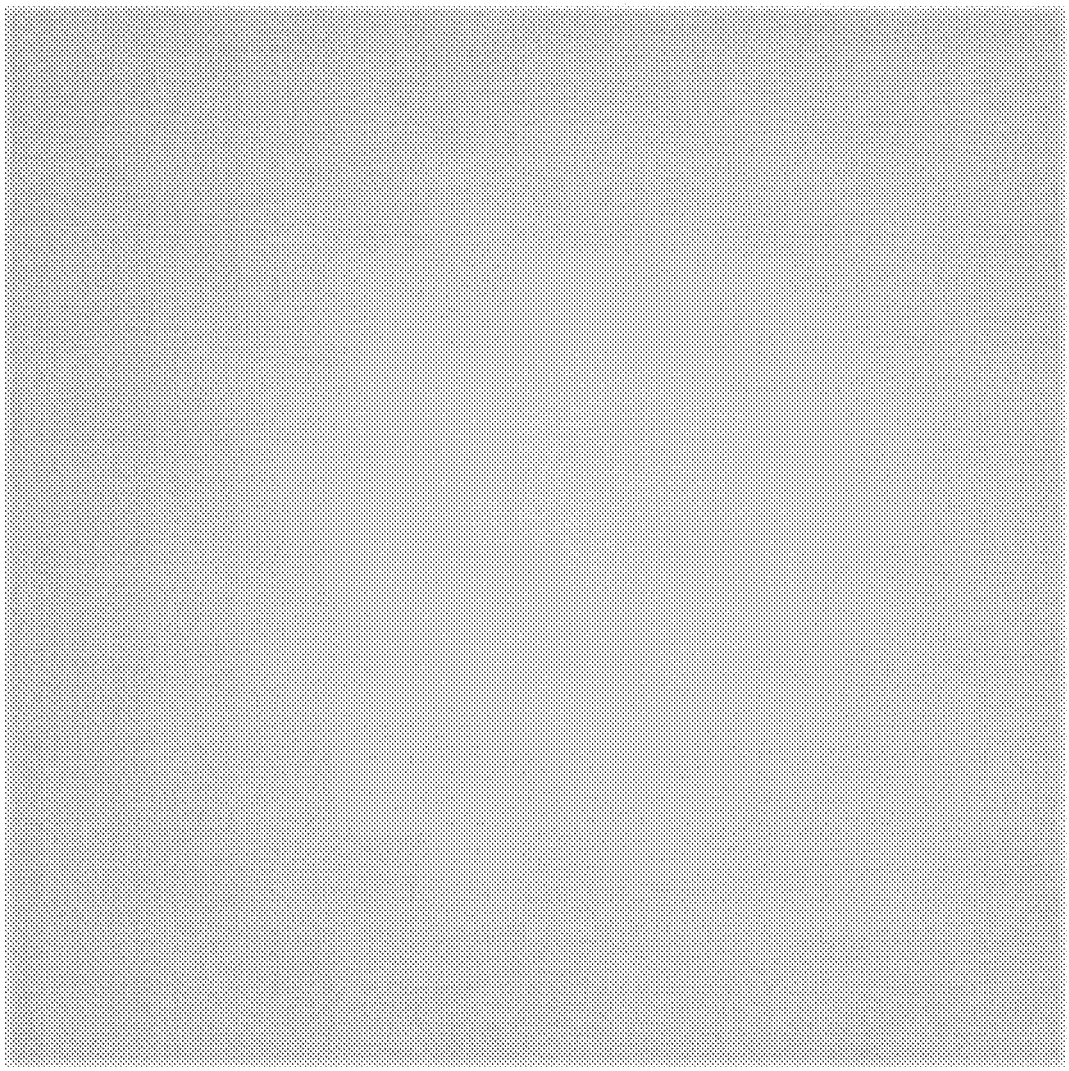

[FIG.3]
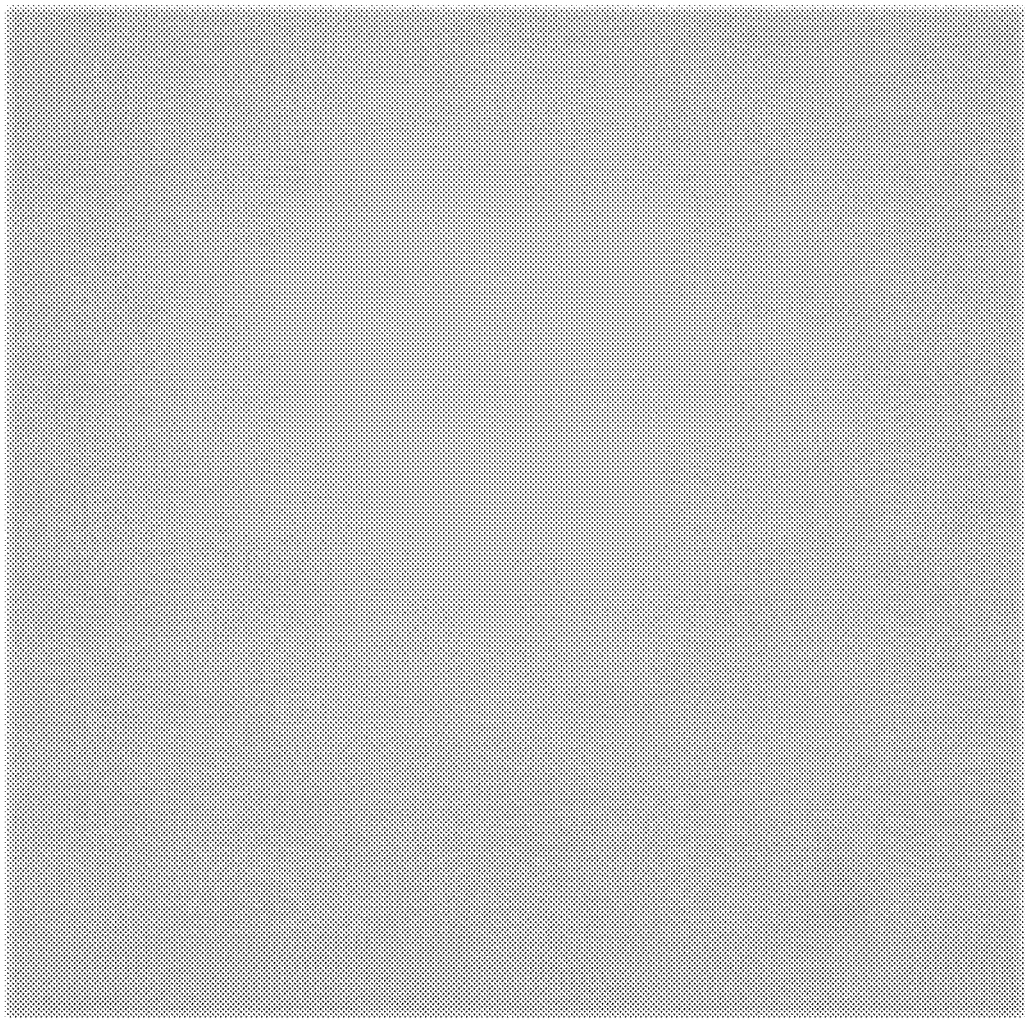

[FIG.4]
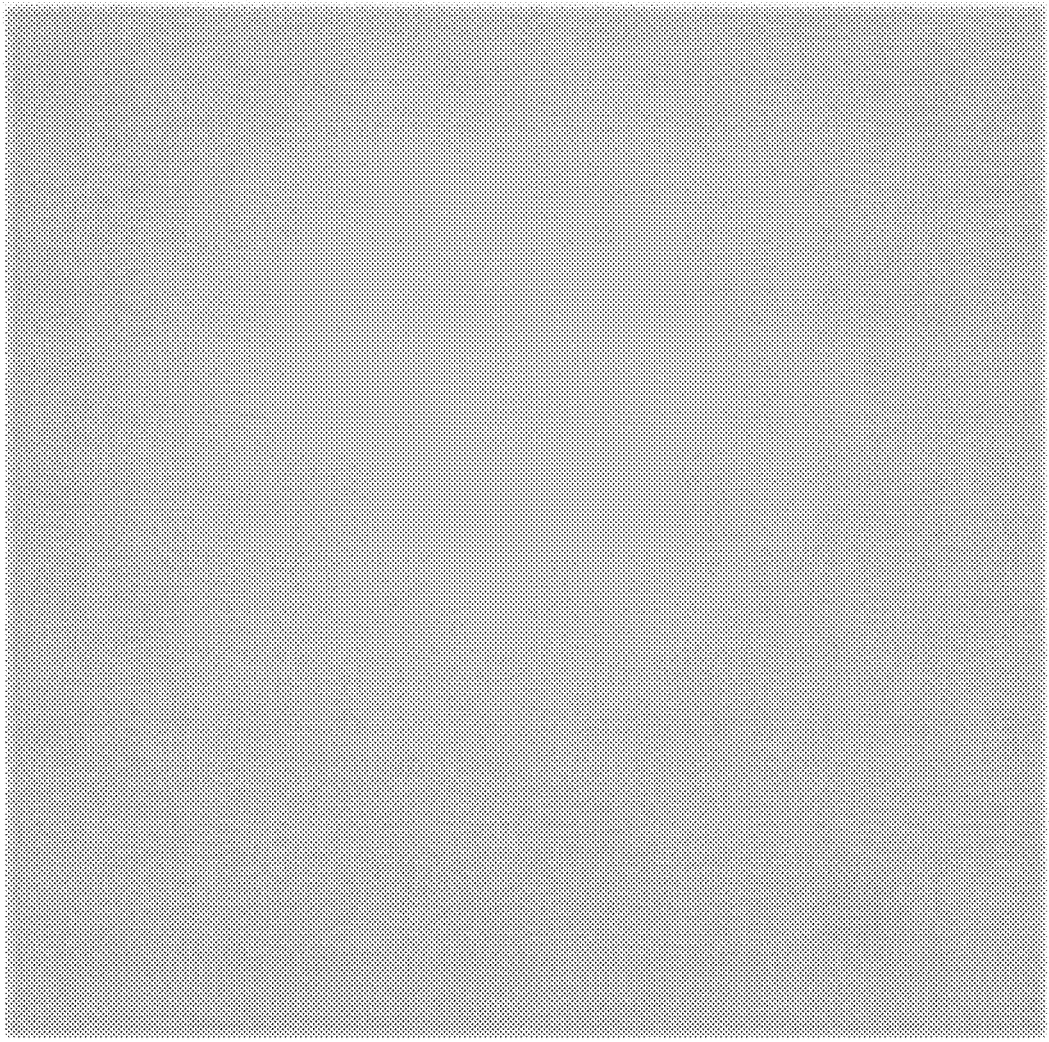

[FIG.5]
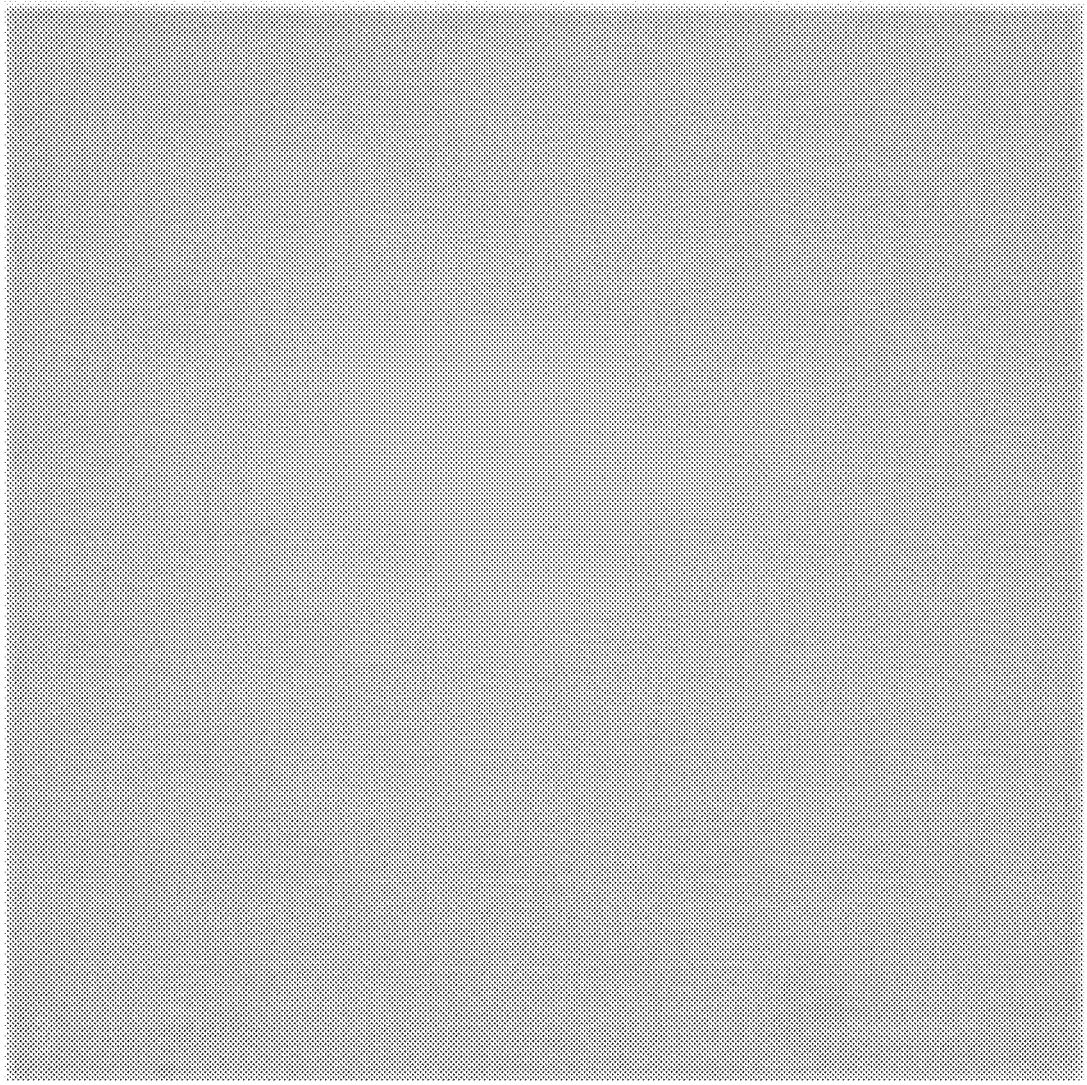

[FIG.6]
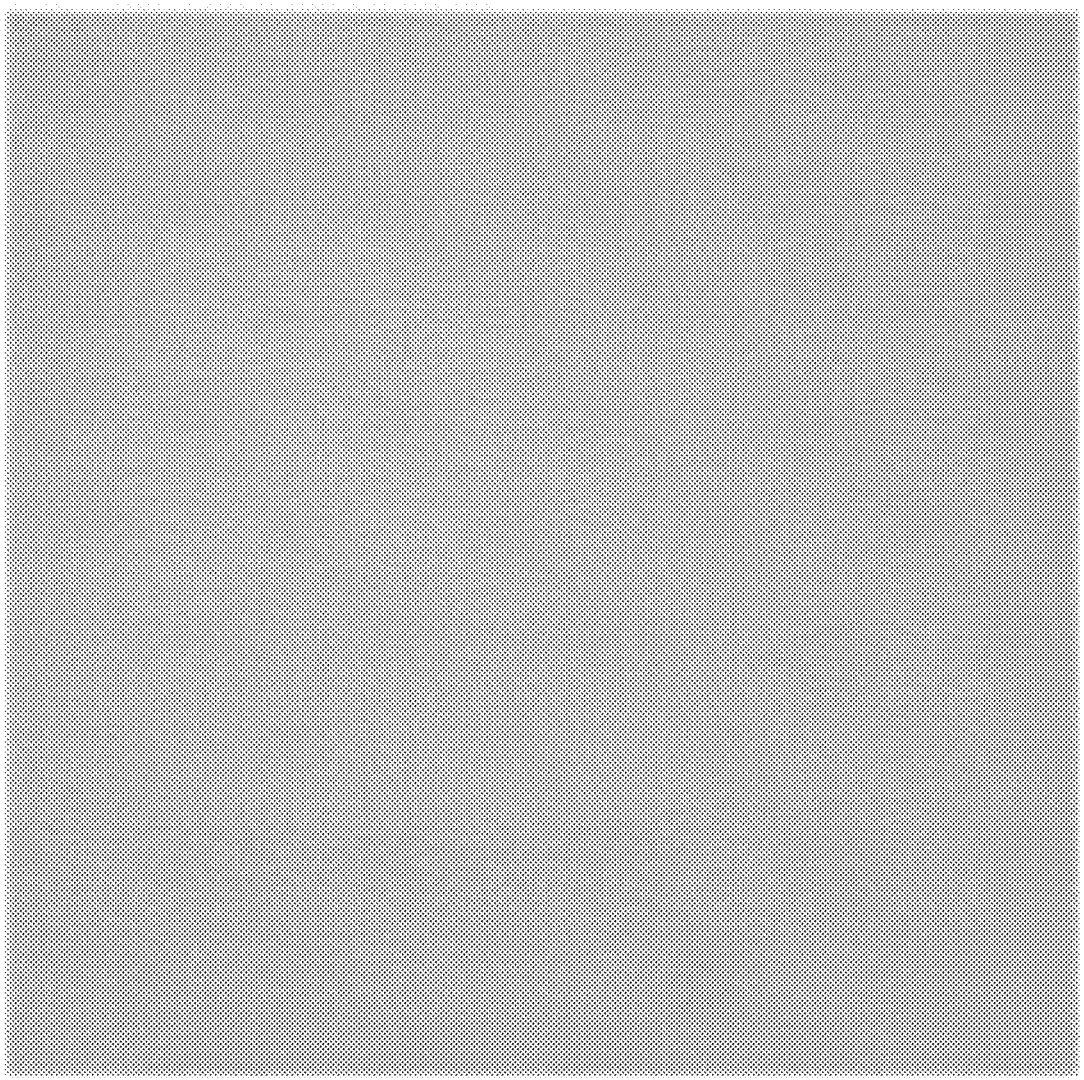

[FIG.7]
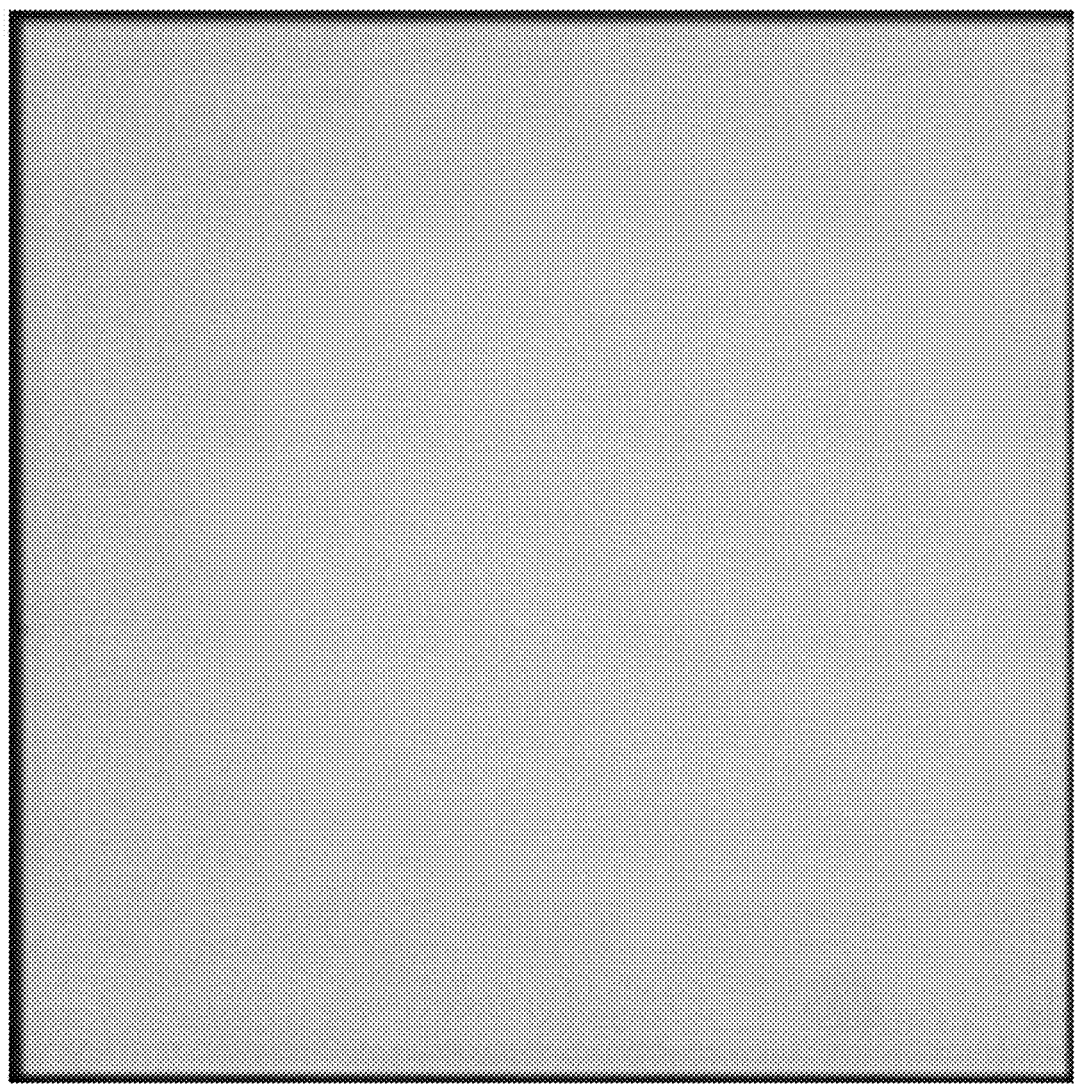

[FIG.8]
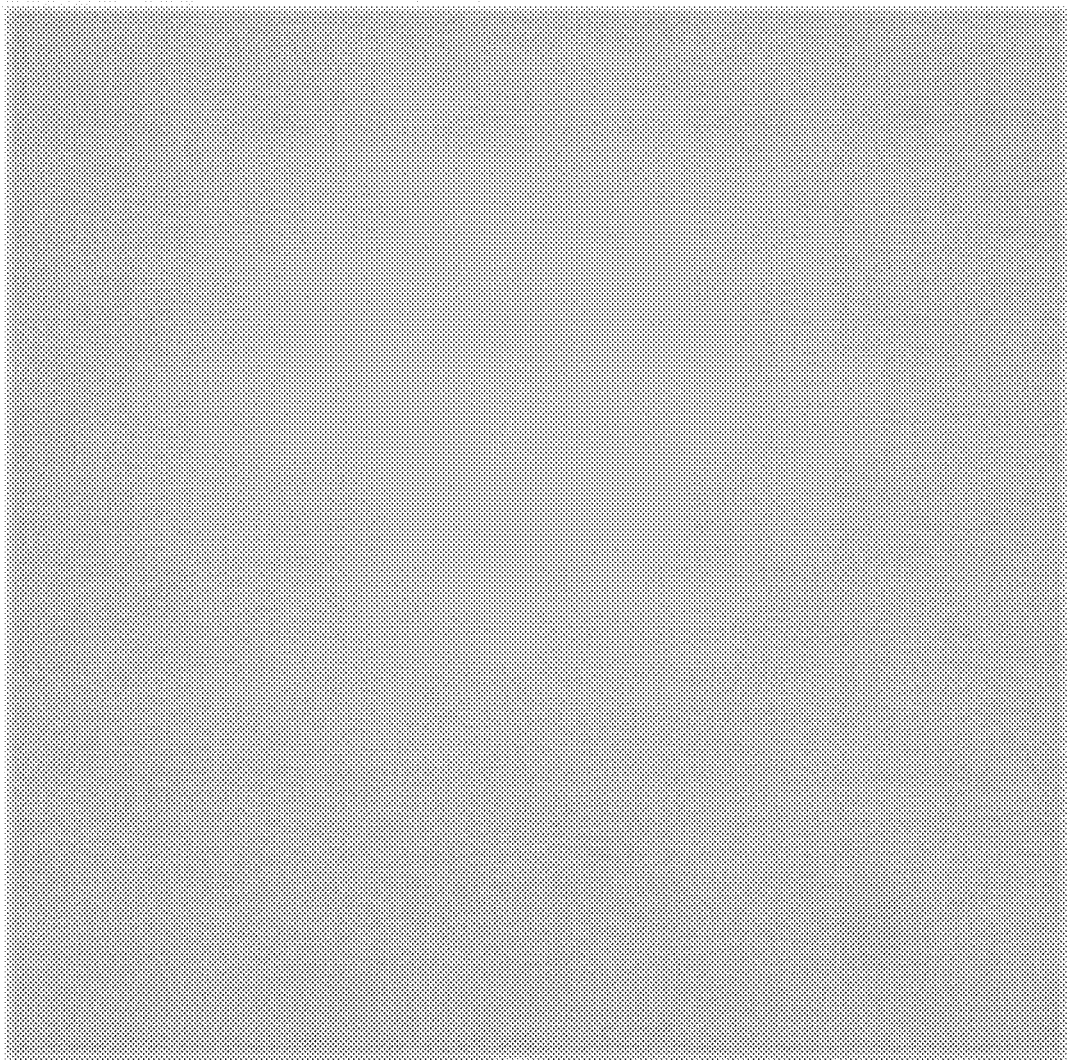

[FIG.9]
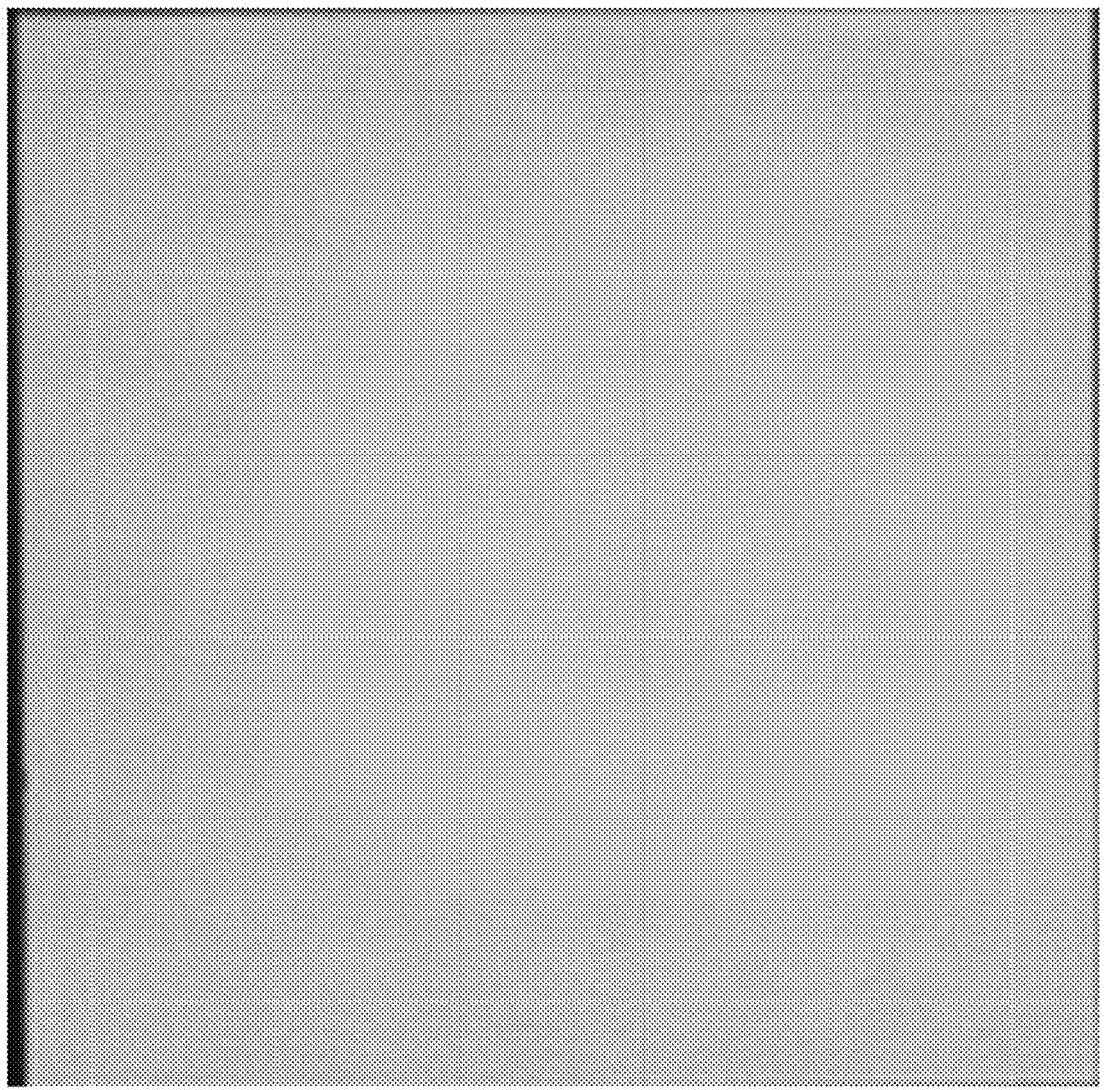

[FIG.10]
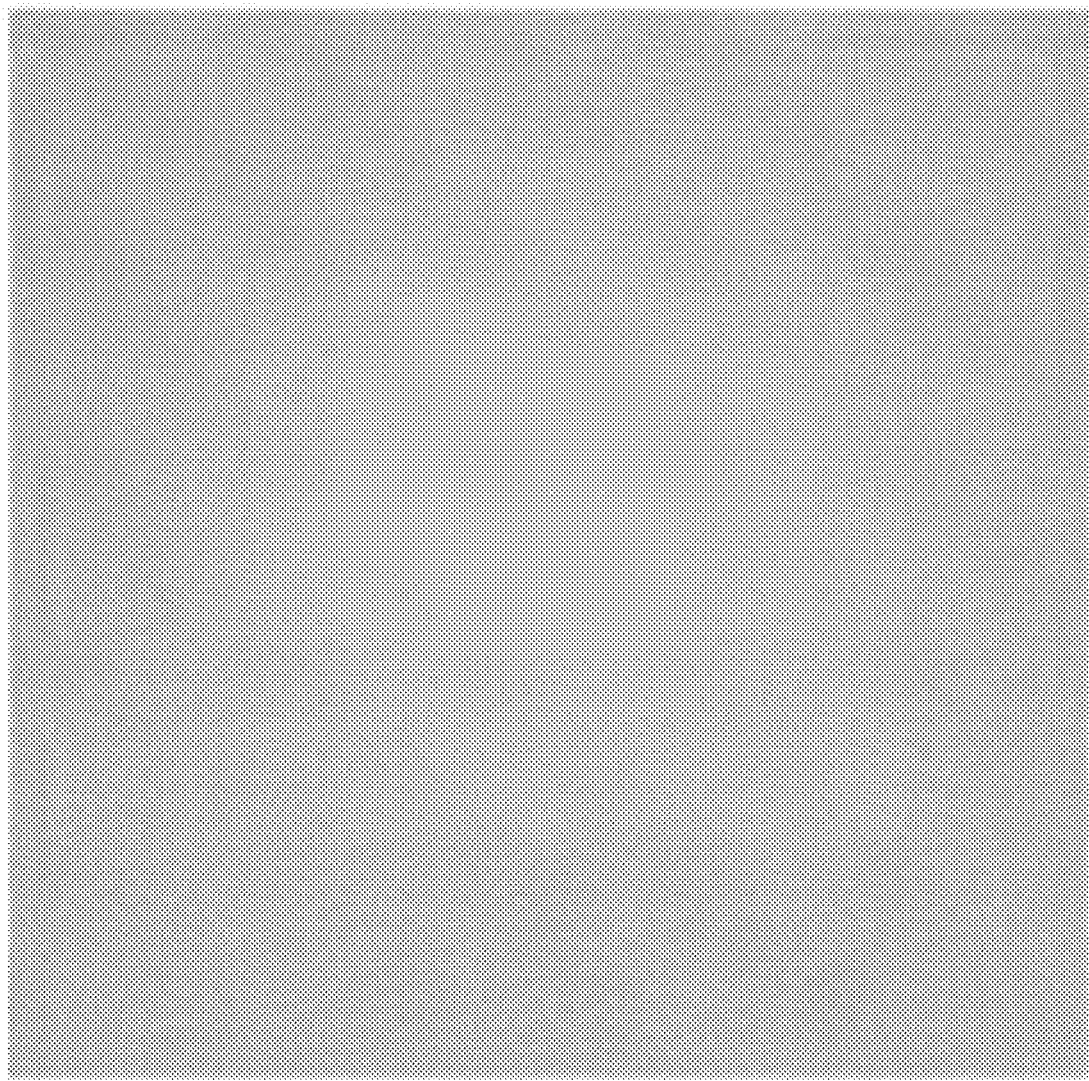

[FIG.11]
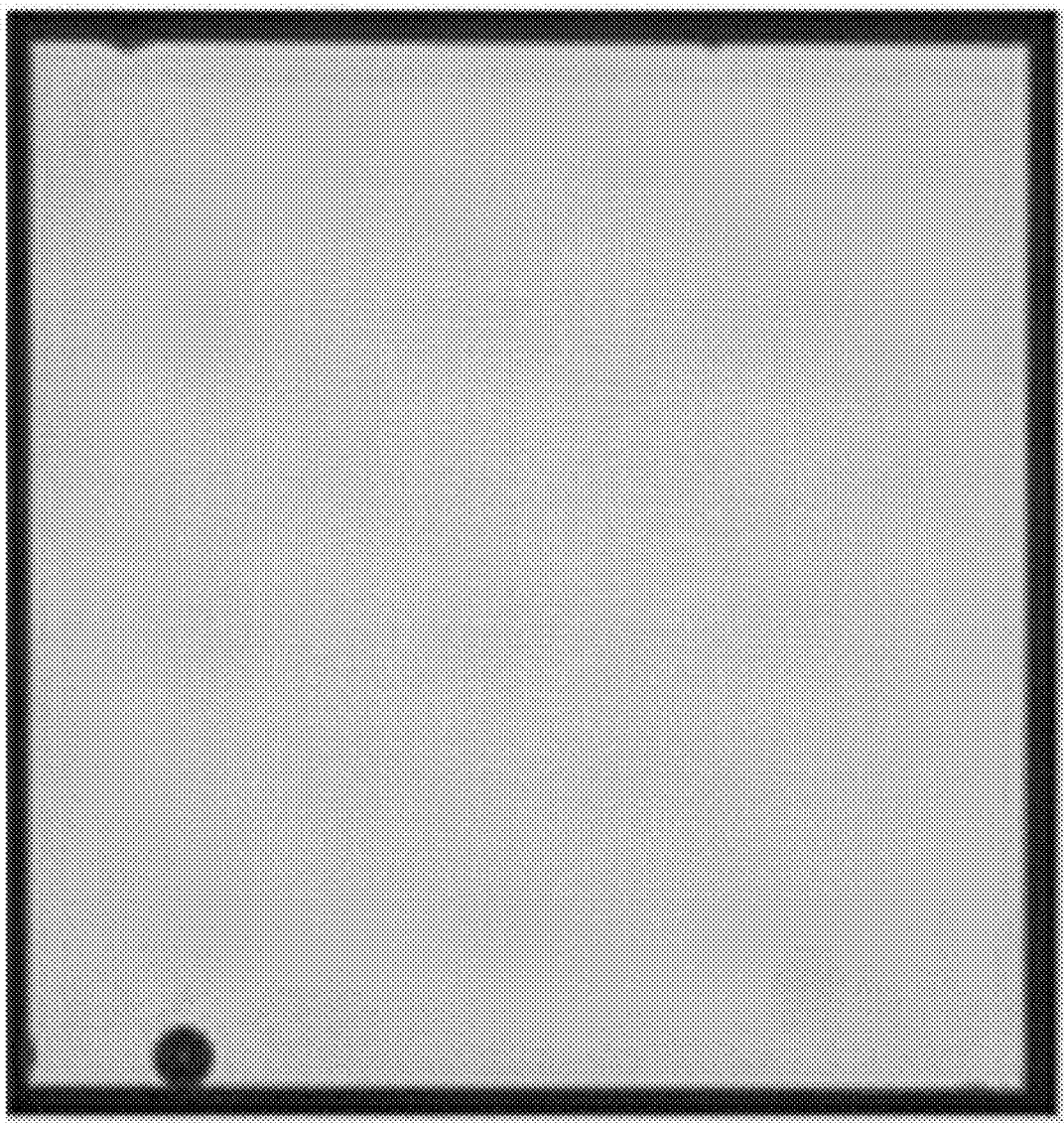

[FIG.12]
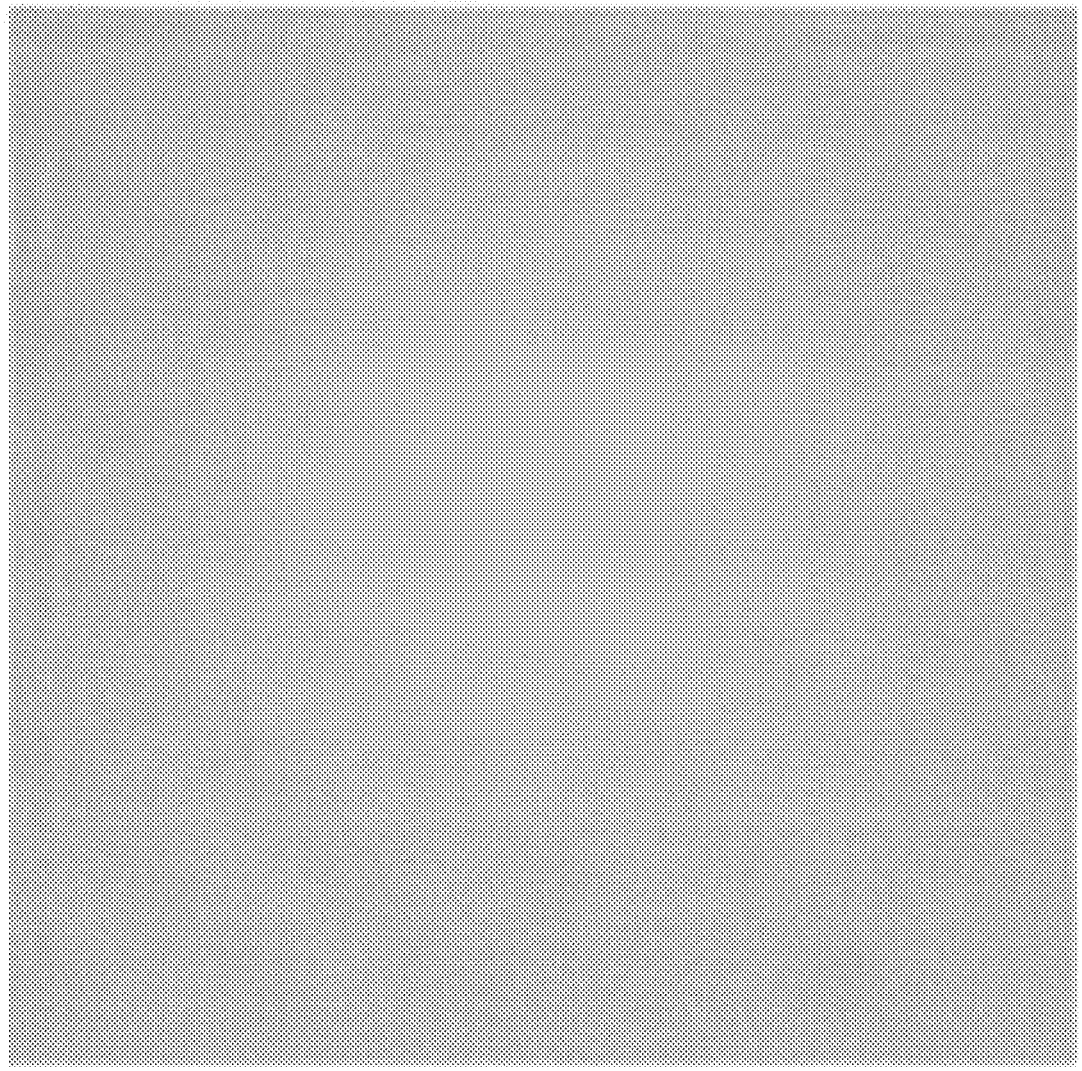

[FIG.13]
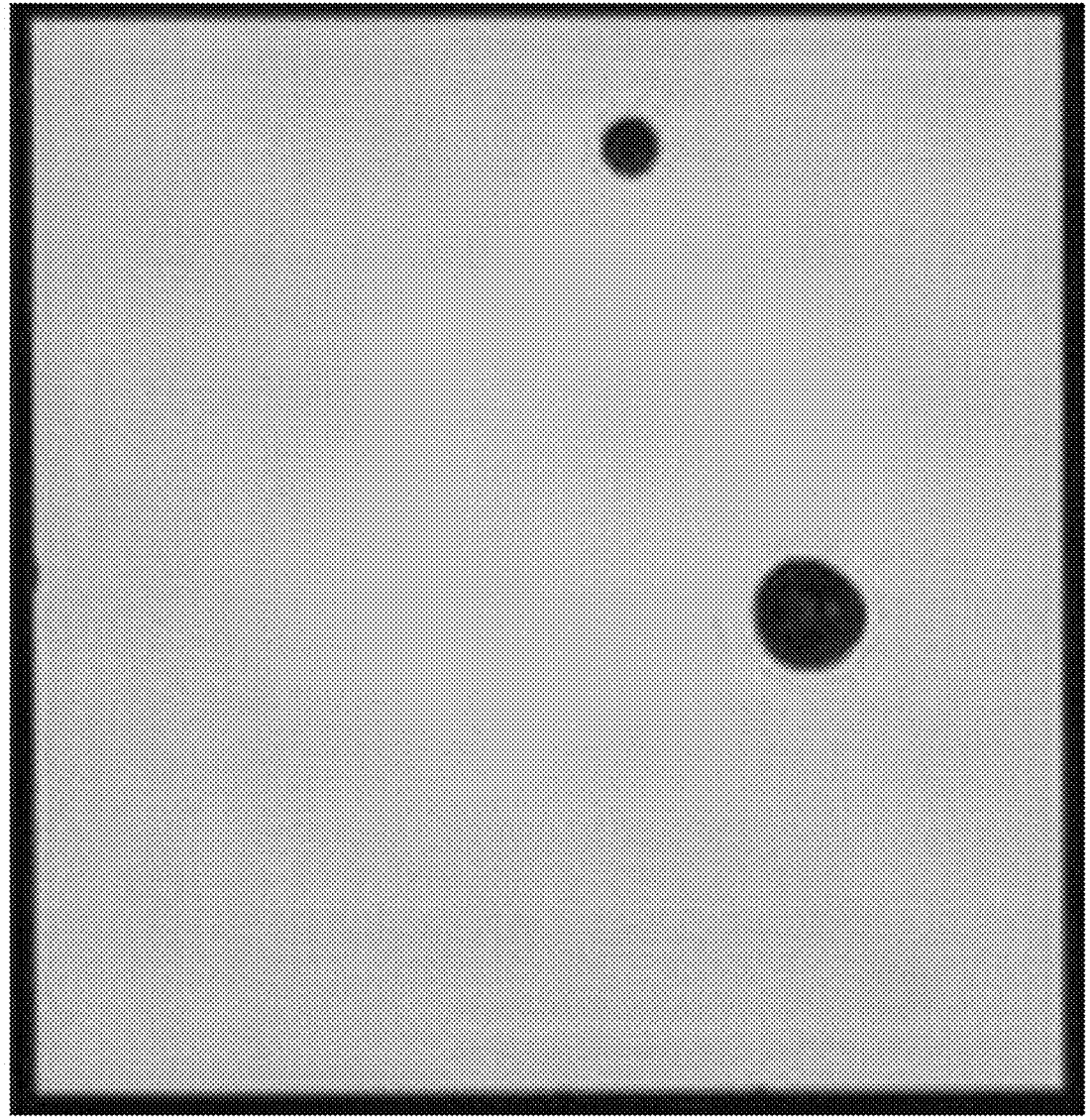

[FIG.14]
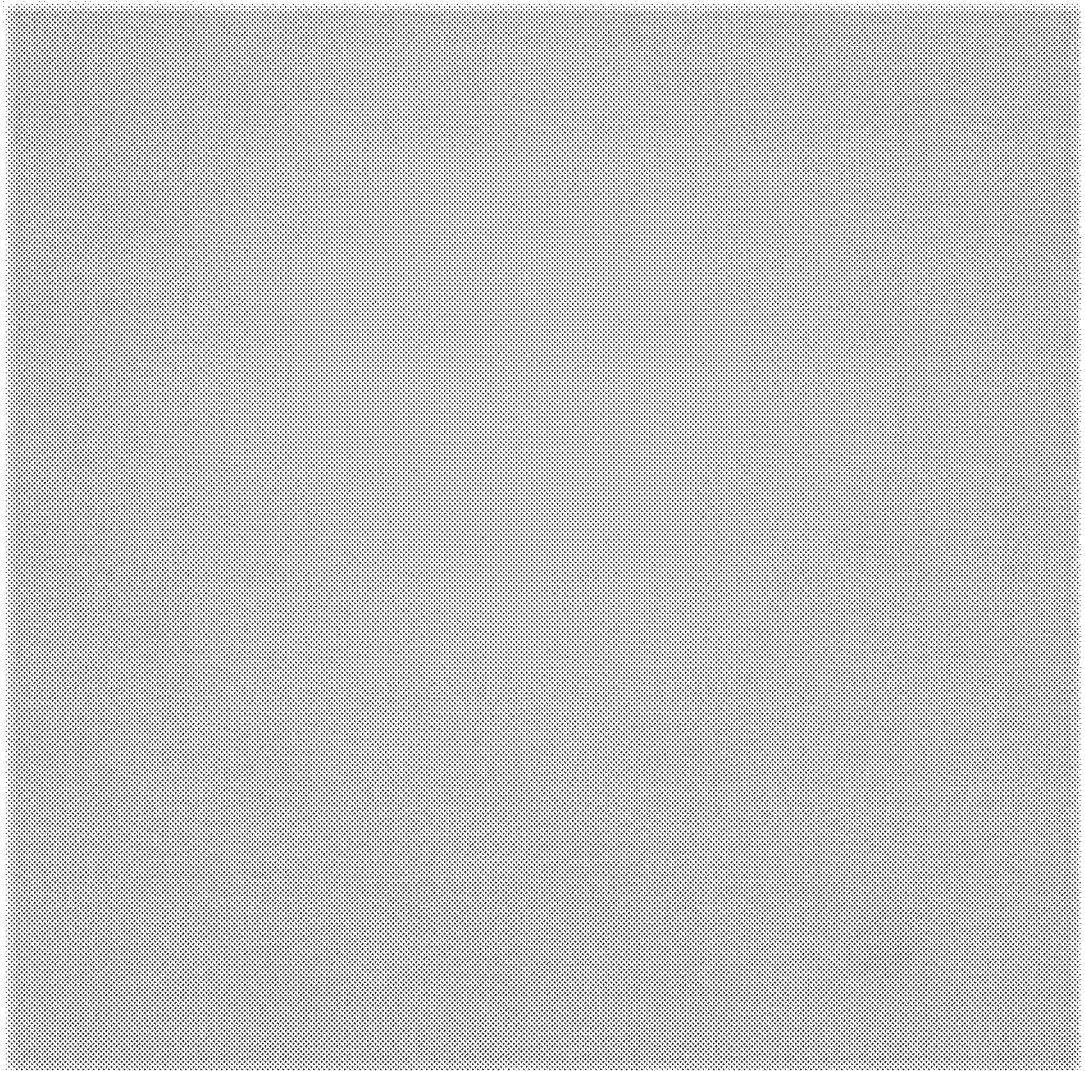

[FIG.15]
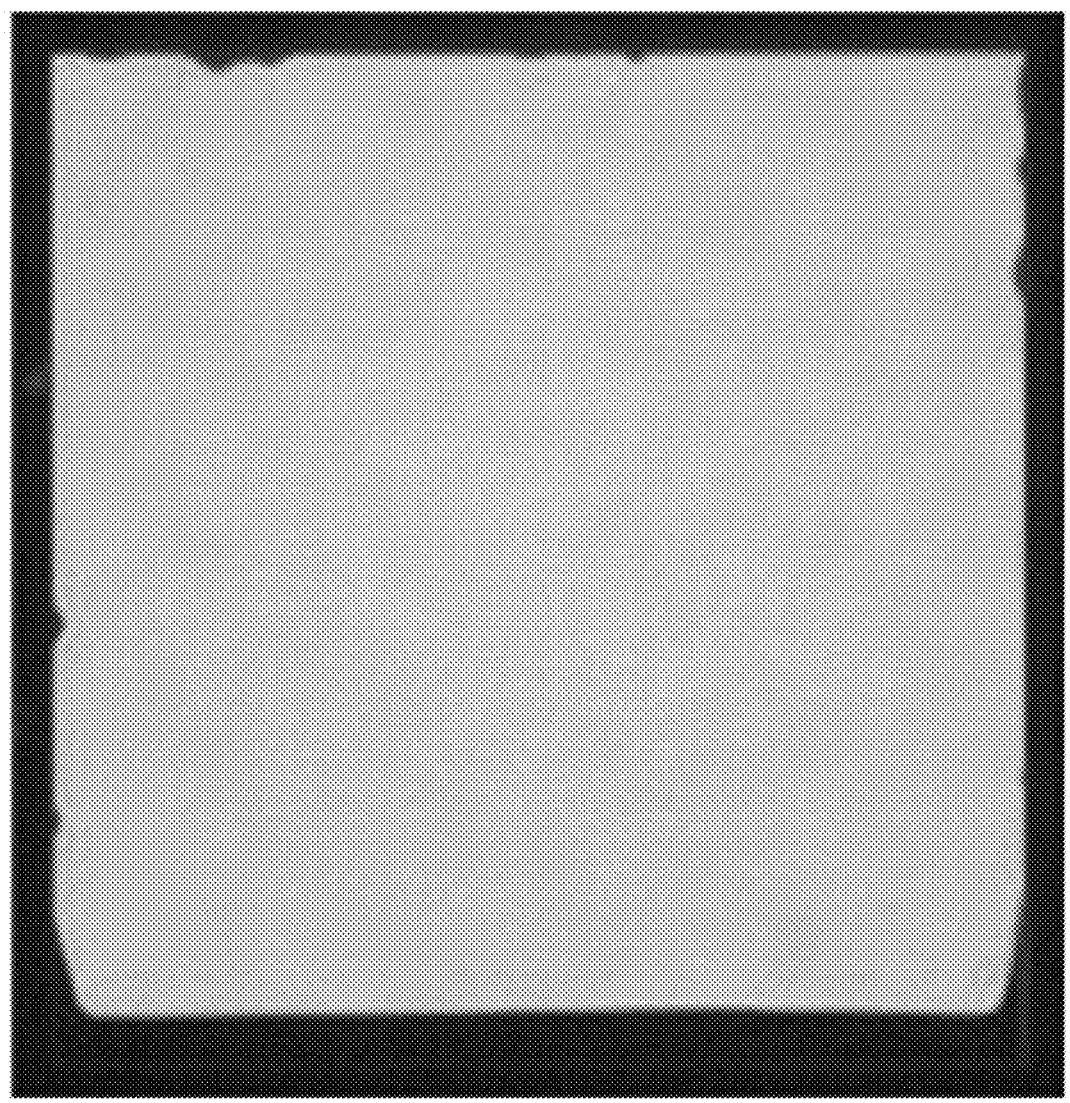

[FIG.16]
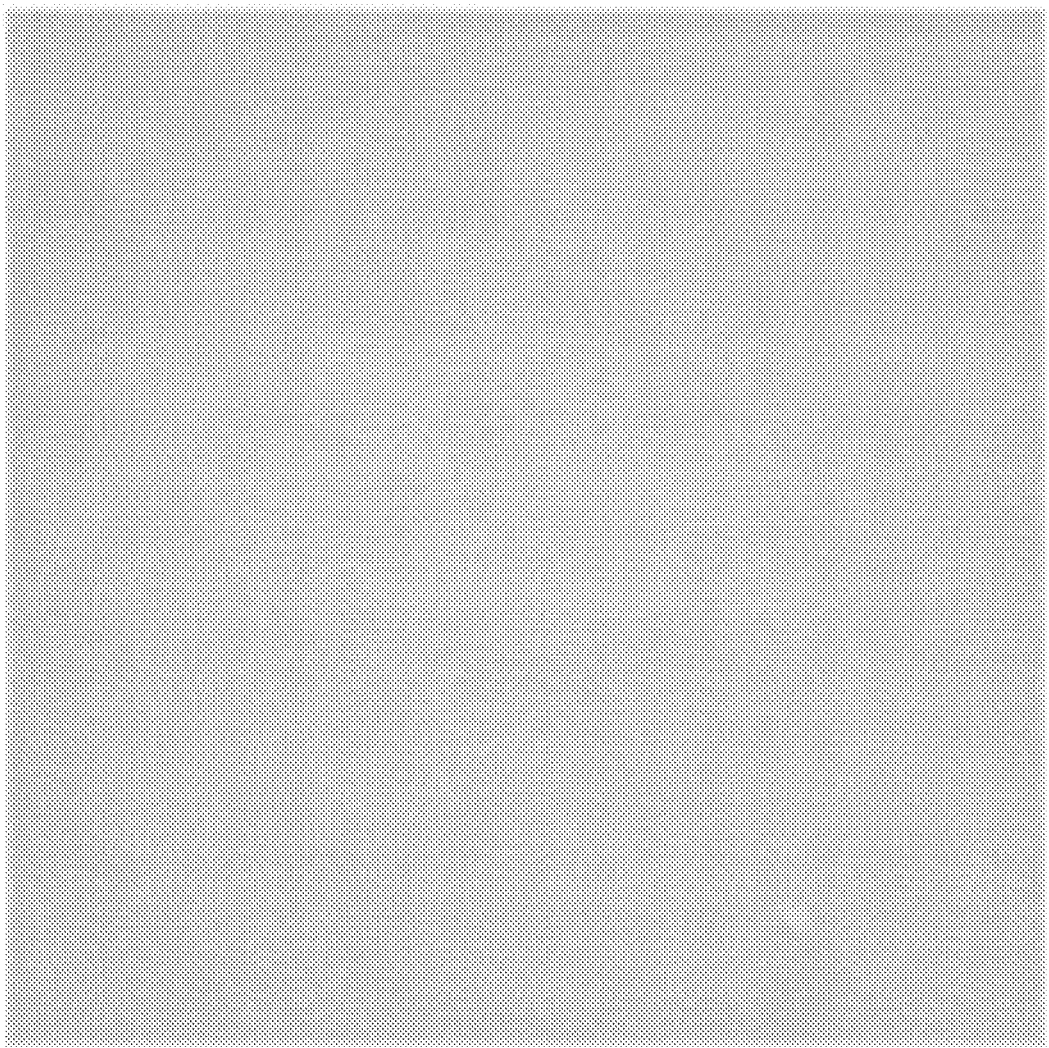

[FIG.17]
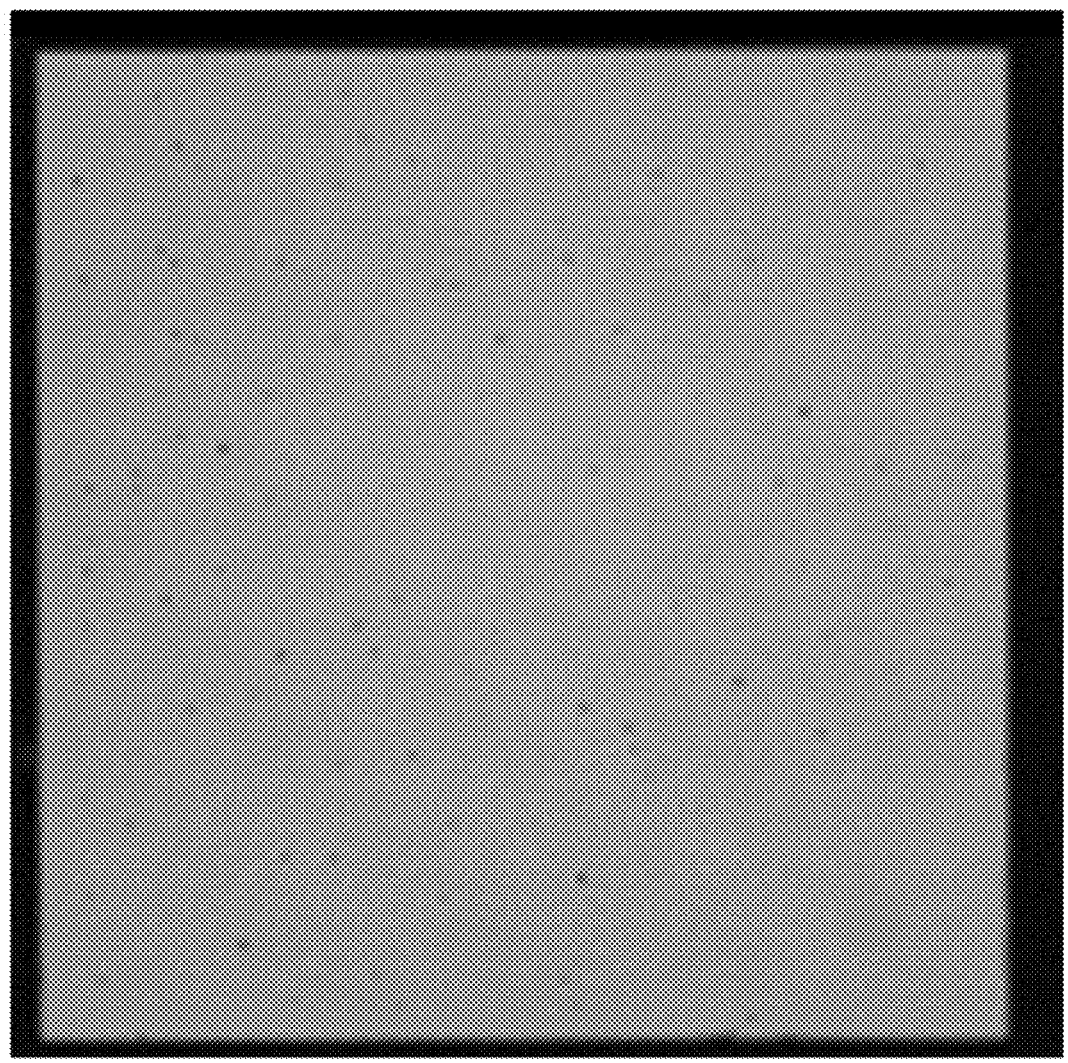

THERMOSETTING COMPOSITION FOR ORGANIC LIGHT-EMITTING ELEMENT FILLER AND ORGANIC LIGHT-EMITTING ELEMENT DISPLAY DEVICE COMPRISING SAME

CROSS REFERENCE TO RELATED APPLICATIONS

This is the U.S. national phase application based on PCT Application No. PCT/KR2013/012293, filed Dec. 27, 2013, which is based on Korean Patent Application No. 10-2013-0032415, filed Mar. 26, 2013, the entire contents of all of which are hereby incorporated by reference.

TECHNICAL FIELD

The present invention relates to a thermosetting composition for organic light emitting diode fillers and an organic light emitting diode display including the same.

BACKGROUND ART

Organic light emitting diodes (OLEDs) are polycrystalline semiconductor devices, are used in backlight units to obtain high brightness light emission at low voltage, and are expected to be used in thin flat displays. However, organic light emitting diodes have problems of vulnerability to moisture, delamination at an interface between a metal layer and an organic electroluminescent (EL) layer under influence of moisture, high resistance due to oxidation of metal, and deterioration in luminous characteristics and reduction in brightness resulting from degradation of organic materials due to moisture.

To solve these problems, a method of encapsulating organic light emitting diodes using a curable composition is developed. Examples of a typical encapsulation method include a method in which an organic light emitting diode is molded from acrylic resins and a method in which a moisture absorbent material is added to an encapsulation resin for an organic light emitting diode to protect the organic light emitting diode from moisture, and the like.

DISCLOSURE

Technical Problem

It is one aspect of the present invention to provide a composition for organic light emitting diode fillers which has good adhesion to a substrate with an organic light emitting diode stacked thereon and low water vapor permeability.

It is another aspect of the present invention to provide a composition for organic light emitting diode fillers which exhibits low outgassing, thereby securing reliability of an organic light emitting diode.

Technical Solution

In accordance with one aspect of the present invention, a thermosetting composition for organic light emitting diode fillers may include: 100 parts by weight of (A) an epoxy-based resin composed of (A1) an epoxy resin having a weight average molecular weight of about 200 g/mol or more to less than about 1,000 g/mol, (A2) an epoxy resin having a weight average molecular weight of about 1,000 g/mol or more to less than about 20,000 g/mol, and (A3) an epoxy resin having a weight average molecular weight of about 20,000 g/mol or more to less than about 100,000 g/mol; about 10 parts by weight to about 40 parts by weight of (B) flake fillers; and about 0.1 parts by weight to about 20 parts by weight of (C) an cyano group-containing imidazole curing agent.

In accordance with another aspect of the present invention, an organic light emitting diode may include a cured product of the thermosetting composition as set forth above.

Advantageous Effects

The present invention provides a composition for organic light emitting diode fillers which has good adhesion to a substrate with an organic light emitting diode stacked thereon and low water vapor permeability, and exhibits low outgassing, thereby securing reliability of the organic light emitting diode.

DESCRIPTION OF DRAWINGS

FIG. 1 is a sectional view of an organic light emitting diode display according to one embodiment of the present invention.

FIG. 2 shows a result of initial reliability testing of an OLED of Example 1, and FIG. 3 shows a result of reliability testing of the OLED of Example 1 after being left at 85° C. and 85% RH for 24 hours.

FIG. 4 shows a result of initial reliability testing of an OLED of Example 2, and FIG. 5 shows a result of reliability testing of the OLED of Example 2 after being left at 85° C. and 85% RH for 24 hours.

FIG. 6 shows a result of initial reliability testing of an OLED of Example 3, and FIG. 7 shows a result of reliability testing of the OLED of Example 3 after being left at 85° C. and 85% RH for 24 hours.

FIG. 8 shows a result of initial reliability testing of an OLED of Example 4, and FIG. 9 shows a result of reliability testing of the OLED of Example 4 after being left at 85° C. and 85% RH for 24 hours.

FIG. 10 shows a result of initial reliability testing of an OLED of Comparative Example 1, and FIG. 11 shows a result of reliability testing of the OLED of Comparative Example 1 after being left at 85° C. and 85% RH for 24 hours.

FIG. 12 shows a result of initial reliability testing of an OLED of Comparative Example 2, and FIG. 13 shows a result of reliability testing of the OLED of Comparative Example 2 after being left at 85° C. and 85% RH for 24 hours.

FIG. 14 shows a result of initial reliability testing of an OLED of Comparative Example 3, and FIG. 15 shows a result of reliability testing of the OLED of Comparative Example 3 after being left at 85° C. and 85% RH for 24 hours.

FIG. 16 shows a result of initial reliability testing of an OLED of Comparative Example 4, and FIG. 17 shows a result of reliability testing of the OLED of Comparative Example 4 after being left at 85° C. and 85% RH for 24 hours.

BEST MODE

A thermosetting composition for organic light emitting diode fillers according to one embodiment of the invention may include: 100 parts by weight of (A) an epoxy-based resin composed of (A1) an epoxy resin having a weight average molecular weight of about 200 g/mol or more to less than about 1,000 g/mol, (A2) an epoxy resin having a weight average molecular weight of about 1,000 g/mol or more to less than about 20,000 g/mol, and (A3) an epoxy resin having a weight average molecular weight of about 20,000 g/mol or more to less than about 100,000 g/mol; about 10 parts by weight to about 40 parts by weight of (B) flake fillers; and about 0.1 parts by weight to about 20 parts by weight of (C) an cyano group-containing imidazole curing agent.

In the thermosetting composition for organic light emitting diode fillers, three epoxy resins each having a weight average molecular weight in a specific range are present in specific amounts. When the thermosetting composition includes all three epoxy resins, the thermosetting composition can easily secure dispersion stability for use as organic light emitting diode fillers without a silane coupling agent, which serves to aid dispersion, while exhibiting uniform adhesion. Particularly, the epoxy resin (A2) can provide enhanced compatibility in a mixture of the epoxy resin (A1) and the epoxy resin (A3), thereby achieving phase stability in preparation of a solution.

Each of the epoxy resins (A1), (A2), (A3) may contain about 0 ppm to about 500 ppm, specifically about 0 ppm to about 200 ppm of hydrolysable chlorine or chlorine ions. Within this range of chlorine content, the thermosetting composition can prevent deterioration in reliability of an OLED after curing of the fillers.

The epoxy resin (A1) may have a weight average molecular weight of about 200 g/mol or more to less than 1,000 g/mol, specifically about 500 g/mol to about 700 g/mol, for example, about 200 g/mol, 300 g/mol, 400 g/mol, 500 g/mol, 600 g/mol, 700 g/mol, 800 g/mol or 900 g/mol. If the weight average molecular weight is less than 200 g/mol, the thermosetting composition has low viscosity and thus spreads onto an OLED when the thermosetting composition directly contacts the OLED, thereby causing dark spots, whereas if the weight average molecular weight is greater than or equal to 1000 g/mol, the amount of a glycidyl reactive group in the thermosetting composition is too small to form sufficient crosslinks.

In the epoxy-based resin (A), the epoxy resin (A1) may be present in an amount of about 10 wt % to about 50 wt %, specifically about 20 wt % to 40 wt %, for example, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt % or 50 wt %. Within this range, it is possible to prevent deterioration in reliability of an OLED due to epoxy resin remaining after curing of the filler composition, and the thermosetting composition can exhibit increased adhesion and further enhance reliability of the OLED.

The epoxy resin (A1) may include an epoxy resin having at least two epoxy groups (for example, glycidyl groups) at terminals thereof. With the epoxy groups, the thermosetting composition for organic light emitting diode fillers can have flowability, which provides processability at room temperature, before curing, and can provide enhanced film strength and barrier properties through crosslinking after curing. In some embodiments, the epoxy resin (A1) has a liquid phase at room temperature (for example, 25° C.), and may include at least one of bisphenol A epoxy resins, bisphenol F epoxy resins, hydrogenated bisphenol epoxy resins, cycloaliphatic epoxy resins, naphthalene epoxy resins, dicyclopentadiene epoxy resins, and biphenyl epoxy resins.

The epoxy resin (A1) is an epoxy resin which has a liquid phase at room temperature (for example, 25° C.), and may have a glass transition temperature of about −40° C. to about 10° C., specifically about −40° C., −39° C., −38° C., −37° C., −36° C., −35° C., −34° C., −33° C., −32° C., −31° C., −30° C., −29° C., −28° C., −27° C., −26° C., −25° C., −24° C., −23° C., −22° C., −21° C., −20° C., −19° C., −18° C., −17° C., −16° C., −15° C., −14° C., −13° C., −12° C., −11° C., −10° C., −9° C., −8° C., −7° C., −6° C., −5° C., −4° C., −3° C., −2° C., −1° C., 0° C., 1° C., 2° C., 3° C., 4° C., 5° C., 6° C., 7° C., 8° C., 9° C. or 10° C. Within this range, it is possible to prevent deterioration in reliability of an OLED due to the epoxy resin remaining after curing of the filler composition, and the thermosetting composition can exhibit increased adhesion and enhance reliability of the OLED.

The epoxy resin (A2) is a resin which has a solid phase at room temperature (for example, 25° C.) and enhances compatibility between the epoxy resin (A1) and the epoxy resin (A3), and may have a weight average molecular weight of about 1,000 g/mol or more to less than about 20,000 g/mol, specifically about 2000 g/mol to about 5,000 g/mol, for example, 1000 g/mol, 2000 g/mol, 3000 g/mol, 4000 g/mol, 5000 g/mol, 6000 g/mol, 7000 g/mol, 8000 g/mol, 9000 g/mol, 10000 g/mol, 11000 g/mol, 12000 g/mol, 13000 g/mol, 14000 g/mol, 15000 g/mol, 16000 g/mol, 17000 g/mol, 18000 g/mol or 19000 g/mol. If the weight average molecular weight is less than 1,000 g/mol, compatibility enhancement by the epoxy resin (A2) is less effective. In addition, the entire resin is in liquid form, and the thermosetting composition thus contains an excess amount of liquid, which can cause defects of an OLED. If the weight average molecular weight is greater than or equal to 20,000 g/mol, the epoxy resin (A2) is less effective in enhancement of compatibility, and the thermosetting composition contains a high percentage of high molecular weight materials, causing deterioration in processability at room temperature of the thermosetting composition.

The epoxy resin (A2) may be present in an amount of about 20 parts by weight to about 50 parts by weight, specifically about 40 parts by weight to about 50 parts by weight, for example, about 20 parts by weight, 21 parts by weight, 22 parts by weight, 23 parts by weight, 24 parts by weight, 25 parts by weight, 26 parts by weight, 27 parts by weight, 28 parts by weight, 29 parts by weight, 30 parts by weight, 31 parts by weight, 32 parts by weight, 33 parts by weight, 34 parts by weight, 35 parts by weight, 36 parts by weight, 37 parts by weight, 38 parts by weight, 39 parts by weight, 40 parts by weight, 41 parts by weight, 42 parts by weight, 43 parts by weight, 44 parts by weight, 45 parts by weight, 46 parts by weight, 47 parts by weight, 48 parts by weight, 49 parts by weight or 50 parts by weight based on 100 parts by weight of (A1) and (A3). In addition, the epoxy resin (A2) may be present in an amount of about 10 wt % to about 40 wt %, specifically about 20 wt % to 40 wt %, for example, about 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt % or 40 wt % based on the total weight of the epoxy-based resin (A). When the epoxy resin (A2) is present in an amount of the aforementioned parts by weight or wt % based on 100 parts by weight of (A1) and (A3) or based on the total weight of the epoxy-based resin (A), the epoxy resin (A2) can enhance compatibility between the epoxy resin (A1) and the epoxy resin (A3), and can further increase curing rate of the epoxy resin (A1) and improve processability at room temperature of the composition.

The epoxy resin (A2) may include at least two epoxy groups (for example, glycidyl groups) at both terminals thereof and one epoxy group (for example, glycidyl group) for each repeat unit thereof. The epoxy group contained in each repeat unit can increase a curing degree of the filler composition, thereby preventing outflow of the uncured epoxy resin (A3), while enhancing adhesion of the composition without silane coupling agents.

In some embodiments, the epoxy resin (A2) is a novolac epoxy resin, and may include at least one of cresol novolac epoxy resins, biphenyl novolac epoxy resins, and naphthalene novolac epoxy resins, without being limited thereto.

The epoxy resin (A2) is an epoxy resin which has a solid phase at room temperature (for example, 25° C.), and may have a glass transition temperature of about 30° C. to about 70° C., for example, about 30° C., 31° C., 32° C., 33° C., 34° C., 35° C., 36° C., 37° C., 38° C., 39° C., 40° C., 41° C., 42° C., 43° C., 44° C., 45° C., 46° C., 47° C., 48° C., 49° C., 50° C., 51° C., 52° C., 53° C., 54° C., 55° C., 56° C., 57° C., 58° C., 59° C., 60° C., 61° C., 62° C., 63° C., 64° C., 65° C., 66° C., 67° C., 68° C., 69° C. or 70° C. Within this range, it is possible to guarantee dispersion stability of the resin and to further ensure reliability of an organic light emitting diode.

The epoxy resin (A2) may be present, in terms of solid content, in an amount of about 15 wt % to about 30 wt %, specifically about 20 wt % to about 25 wt %, for example, about 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt % in the composition for organic light emitting diode fillers. Within this range, the composition can further secure reliability of an organic light emitting diode.

The epoxy resin (A3) may have a weight average molecular weight of greater than or equal to about 20,000 g/mol or more and less than about 100,000 g/mol, specifically about 40,000 g/mol to 60,000 g/mol, for example, 20000 g/mol, 30000 g/mol, 40000 g/mol, 50000 g/mol, 60000 g/mol, 70000 g/mol, 80000 g/mol or 90000 g/mol. If the weight average molecular weight is less than 20,000 g/mol, the composition cannot be formed into a film, whereas if the weight average molecular weight is greater than or equal to 100,000 g/mol, the composition has low solubility and high viscosity, which makes it difficult to manage film appearance.

The epoxy resin (A3) may be present in an amount of about 10 wt % to about 50 wt %, specifically about 20 wt % to about 40 wt %, for example, about 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt % or 50 wt % in the epoxy-based resin (A). Within this range, it is possible to further secure film formation and sufficient coating strength.

The epoxy resin (A3) has a solid phase at room temperature (for example, 25° C.) and may have at least two epoxy groups (for example, glycidyl groups) at terminals thereof. The epoxy group can realize crosslinking effects during curing of the composition. In some embodiments, the epoxy resin (A3) may include a resin having a bisphenol A or bisphenol F epoxy backbone. For example, the epoxy resin (A3) may include at least one of solid phase bisphenol A epoxy resins, solid phase bisphenol F epoxy resins, solid phase phenoxy resins, solid phase dicyclopentadiene epoxy resins, and solid phase biphenyl epoxy resins, without being limited thereto.

The epoxy resin (A3) is an epoxy resin which has a solid phase at room temperature (for example, 25° C.), and may have a glass transition temperature of about 50° C. to about 120° C.

The epoxy-based resin (A) may be present, in terms of solid content, in an amount of about 55 wt % to about 90 wt %, specifically about 55 wt % to about 85 wt %, or about 65 wt % to about 90 wt %, more specifically about 55 wt % to about 80 wt %, for example, about 55 wt %, 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt % or 90 wt % in the composition. Within this range, the composition can exhibit good adhesion after curing and film formability and enhance reliability of an OLED, while preventing deterioration in reliability of the OLED due to the epoxy resin remaining after curing.

The thermosetting composition for organic light emitting diode fillers includes a relatively large amount of flake fillers as compared with typical compositions. Since the thermosetting composition contains a relatively large amount of flake fillers, it is possible to control dispersion of low molecular weight materials within a film.

The flake fillers provide water absorption ability by blocking or lengthening a movement path of moisture by virtue of the plate shape thereof rather than through physical adsorption or chemical bonding, and can prevent an adhesive layer in the form of a film or the like from expanding by heat even under high temperature conditions.

The flake fillers may include flake powder having a length of about 10 nm to 100 μm in a longitudinal direction, a width of about 50 nm to about 10 μm in a transverse direction, and a thickness of about 50 nm to 10 μm. When the flake fillers have a size in this range, the composition can exhibit low moisture permeability and good film formability.

The flake fillers are not particularly limited so long as the fillers have a flake structure, and may include at least one of talc, mica, flake silicate, graphite, and clay. Specifically, the flake fillers may be talc.

The flake fillers may be present in an amount of about 10 parts by weight to about 40 parts by weight, specifically about 15 parts by weight to about 30 parts by weight, for example, 10 parts by weight, 11 parts by weight, 12 parts by weight, 13 parts by weight, 14 parts by weight, 15 parts by weight, 16 parts by weight, 17 parts by weight, 18 parts by weight, 19 parts by weight, 20 parts by weight, 21 parts by weight, 22 parts by weight, 23 parts by weight, 24 parts by weight, 25 parts by weight, 26 parts by weight, 27 parts by weight, 28 parts by weight, 29 parts by weight, 30 parts by weight, 31 parts by weight, 32 parts by weight, 33 parts by weight, 34 parts by weight, 35 parts by weight, 36 parts by weight, 37 parts by weight, 38 parts by weight, 39 parts by weight or 40 parts by weight based on 100 parts by weight of the epoxy-based resin (A). If the flake fillers are present in an amount of less than about 10 parts by weight, the flake fillers cannot prevent spread of residual low molecular weight materials in a film, whereas if the flake fillers are present in an amount of greater than about 40 parts by weight, the flake fillers can disrupt dispersion stability of the resin.

The flake fillers may be present in an amount of about 1 wt % to about 30 wt %, specifically about 5 wt % to about 29 wt %, for example, about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt % or 30 wt % in the thermosetting composition for organic light emitting diode fillers. Within this range, the composition can have moisture-proof properties, exhibit good film formability, do not suffer from physical defects due to surface unevenness caused by the fillers.

The imidazole curing agent may include an imidazole curing agent which has an activation temperature of about 100° C. to about 160° C. and contains a cyano group. As used herein, the term "activation temperature" may refer to a temperature at which the imidazole curing agent reacts with the epoxy resin to initiate curing. For example, the imidazole curing agent may include at least one of 1-cyanoethyl-2-phenylimidazole, 1-cyanoethyl-2-undecylimidazolium-trimellitate, and 1-cyanoethyl-2-phenylimidazolium-trimellitate, without being limited thereto.

The imidazole curing agent is a curing agent which has a solid phase at room temperature (for example, 25° C.), may have a melting point of about 90° C. to about 250° C.

The imidazole curing agent may be present in an amount of about 0.1 parts by weight to about 20 parts by weight, specifically about 5 parts by weight to about 15 parts by weight, for example, about 5 parts by weight, 6 parts by weight, 7 parts by weight, 8 parts by weight, 9 parts by weight, 10 parts by weight, 11 parts by weight, 12 parts by weight, 13 parts by weight, 14 parts by weight or 15 parts by weight based on 100 parts by weight of the epoxy-based resin (A). Within this range, the composition can be sufficiently thermally cured, and can be prevented from suffering deterioration in transmittance due to residual curing agent.

The imidazole curing agent may be present, in terms of solid content, in an amount of about 1 wt % to about 15 wt %, specifically about 5 wt % to about 10 wt %, for example, about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, or 15 wt % in the thermosetting composition for organic light emitting diode fillers. Within this range, the composition can be sufficiently thermally cured, and an OLED can be prevented from suffering deterioration in reliability due to the residual curing agent.

A thermally cured product of the thermosetting composition for organic light emitting diode fillers exhibits adhesive properties at room temperature (for example, 25° C.) and can be attached to a substrate having an organic light emitting diode formed thereon with predetermined adhesive strength. In some embodiments, the thermally cured product (for example, adhesive film) may have an adhesive strength to a glass substrate of about 65 gf/m² to about 100 gf/m².

The thermosetting composition for organic light emitting diode fillers may have a water vapor transmission rate of about 0 g/m²·day to about 60 g/m²·day, for example, about 30 g/m²·day to about 60 g/m²·day, as measured on a 20 μm thick film sample under conditions of 50° C., 100% RH, and 760 mmHg for 24 hours.

The thermosetting composition for organic light emitting diode fillers exhibits non-flow characteristics at 25° C., and may have a flow beginning temperature of higher than about 25° C. and less than about 50° C., specifically about 40° C. to about 46° C., for example, about 26° C., 27° C., 28° C., 29° C., 30° C., 31° C., 32° C., 33° C., 34° C., 35° C., 36° C., 37° C., 38° C., 39° C., 40° C., 41° C., 42° C., 43° C., 44° C., 45° C., 46° C., 47° C., 48° C. or 49° C. Within this range, the composition can exhibit flowability when attached to a surface of an organic light emitting diode, thereby increasing a surface area at which interfacial adhesion is achieved, and can have enhanced adhesion due to crosslinking through thermal curing for a predetermined period of time. As used herein, the term "flow beginning temperature" may refer to a temperature at which the filler composition softens by heating and begins to flow.

The thermosetting composition for organic light emitting diode fillers may include no silane coupling agent. Despite not including a silane coupling agent, the thermosetting composition for organic light emitting diode fillers can secure sufficient adhesion to be used as an organic light emitting diode filler, realize film coating properties, and enhance reliability of an OLED.

The thermosetting composition for organic light emitting diode fillers may further include at least one additive. The additive can improve surface leveling properties and coating properties of the composition. The additive may include, for example, at least one selected from the group consisting of leveling agents, antifoaming agents, preservation stabilizers, and plasticizers, without being limited thereto.

The thermosetting composition for organic light emitting diode fillers may be formulated in the form of an adhesive film, as an organic light emitting diode filler. The adhesive film may be prepared by drying and laminating the filler composition. For example, the adhesive film may be prepared by drying at a temperature of about 20° C. to about 100° C. and a drying rate of about 0.2 m/s to about 1.5 m/s, without being limited thereto.

The adhesive film may have a thickness of about 1 μm to about 100 μm, specifically about 10 μm to about 50 μm. Within this range, the adhesive film can provide good adhesion between an organic EL device and an encapsulation film.

An organic light emitting diode display according to the present invention may include a cured product of the thermosetting composition according to embodiments of the invention. In some embodiments, the display includes: a first substrate having an organic light emitting diode formed on one surface thereof; a second substrate placed above the first substrate and separated therefrom; and an adhesive layer interposed between the first substrate and the second substrate to bond the first substrate to the second substrate, wherein the adhesive layer may include a cured product, specifically a thermally cured product of the thermosetting composition for organic light emitting diode fillers according to embodiments of the invention.

The composition may be subjected to thermal curing at 100° C. for 2 hours, although thermal curing conditions are not limited thereto.

FIG. 1 is a sectional view of an organic light emitting diode display according to one embodiment of the present invention. Referring to FIG. 1, the organic light emitting diode display according to this embodiment may include an organic light emitting diode D, a first substrate 110 having the organic light emitting diode D on an upper surface thereof, a second substrate 120 placed above the first substrate 110 and separated therefrom, and an adhesive layer 170 interposed between the first substrate 110 and the second substrate 120 to bond the first substrate 110 to the second substrate 120.

The first substrate may be formed of a material such as transparent glass, a plastic sheet, silicon, or a metal substrate, and may have flexibility or not, or transparency or not. The first substrate is formed on one surface thereof with one or more organic EL devices. The organic EL device includes a transparent electrode, a hole transport layer, an organic EL layer, and a rear surface electrode.

The second substrate may be placed above the organic EL device and the first substrate to be separated therefrom, and bonded to the first substrate through the adhesive layer. As the second substrate, a glass substrate or a substrate having good barrier properties such as a plastic sheet with a metal stacked thereon may be used.

A getter 150 may be formed between the first substrate and the second substrate and on each side of the organic EL device to bond the first substrate to the second substrate.

MODE FOR INVENTION

Hereinafter, the present invention will be described in more detail with reference to some examples. However, it should be understood that these examples are provided for illustration only and are not to be in any way construed as limiting the present invention.

Details of components used in Examples and Comparative Examples and methods of evaluating properties are as follows:

(A) Epoxy-based resin: (A1) Epoxy resin having Mw of greater than or equal to 200 g/mol and less than 1,000 g/mol (KDS8128, Kukdo Chemical, having a liquid phase at 25° C.), (A2) Epoxy resin having Mw of greater than or equal to 1000 g/mol and less than 20,000 g/mol (YDCN-500-90P, Kukdo Chemical, having a solid phase at 25° C.), (A3) Epoxy resin having an Mw of greater than or equal to 20,000 g/mol and less than 100,000 g/mol (JER4275, Mitsubishi chemical, solid phase at 25° C.)

(B) Plate shape filler: Talc (D-1000, Nippon talc)

(C) Imidazole curing agent: 2PZCNS (1-cyanoethyl-2-phenylimidazolium trimellitate, solid powder)

(D) Liquid imidazole curing agent: (D1) 2P4MZ (Shikoku, 2-phenyl-4-methylimidazole, solid), (D2) 2E4MZ (Shikoku, 2-ethyl4-methylimidazole, liquid)

Examples 1 to 4

The epoxy resin (A2), the epoxy resin (A3), and the flake fillers were dispersed in MEK (methyl ethyl ketone) in amounts as listed in Table 1 (unit: parts by weight). After stirring the solution, the epoxy resin (A1) and the imidazole curing agent (C) were added to the solution in amounts as listed in Table 1, followed by dispersion using a planetary mixer and a 3-roll mill, thereby preparing a thermosetting composition for organic light emitting diode fillers.

Comparative Examples 1 to 2

A thermosetting composition for organic light emitting diode fillers was prepared in the same manner as in Example 1 except that the kind and amount of the imidazole curing agent were changed to those listed in Table 2.

Comparative Examples 3 to 4

A thermosetting composition for organic light emitting diode fillers was prepared in the same manner as in Example 1 except that the amount of the flake fillers was changed as listed in Table 2.

Each of the thermosetting compositions for organic light emitting diode fillers prepared in Examples and Comparative Examples was formed into a coating film using an applicator, followed by drying and lamination, thereby preparing a 20 μm thick adhesive film for fillers. Each of the prepared adhesive films was evaluated as to the following properties. Results are shown in Tables 1 to 2.

(1) Adhesive strength (die shear strength): Each of the adhesive films for a filler was attached to a glass panel having a size of 5 mm×5 mm (width×length), followed by thermal curing at 100° C. for 2 hours. For the resulting adhesive film, adhesive strength was measured under conditions of a load cell capacity of 100 N, a speed of 50 μm/sec, and a test load of 1 kgf using a die shear strength tester.

(2) Water vapor transmission rate (WVTR): Each of the adhesive films for fillers was subjected to thermal curing at 100° C. for 2 hours. For the resulting adhesive film having a thickness of 20 μm, MOCON testing (PERMATRAN-W 3/33, MOCON Co., Ltd.) was conducted under conditions of 50° C., 100% RH and 760 mmHg for 24 hours while introducing nitrogen gas as a carrier gas.

(3) Outgassing amount: Each of the adhesive films for fillers was attached to a glass substrate, thereby obtaining a filler specimen having a size of 20 cm×20 cm×20 μm (width×length×thickness) and not subjected to thermal curing. Outgassing amount was measured on the specimen using a GC/MS tester (Perkin Elmer Clarus 600). GC/MS employed a DB-5MS column (length: 30 m, diameter: 0.25 mm, thickness of stationary phase: 0.25 μm) as a column, and helium gas (flow rate: 1.0 mL/min, average velocity=32 cm/s) as a mobile phase. Further, the split ratio was 20:1, and the specimen was maintained at 40° C. for 3 minutes, heated at a rate of 10° C./min and then maintained at 320° C. for 6 minutes. Outgas was collected under the conditions that a glass size was 20 cm×20 cm, a collection container was a Tedlar bag, collection temperature was 90° C., collection time was 30 minutes, $N_2$ purging was performed at a flow rate of 300 mL/min, and Tenax GR (5% phenyl methyl polysiloxane) was used as an adsorbent. A calibration curve was plotted using a toluene solution in n-hexane in a concentration of 150 ppm, 400 ppm and 800 ppm as a standard solution, wherein R2 value was 0.9987.

(4) Flow beginning temperature: Flow beginning temperature of the filler was measured in a temperature range of 25° C. to 140° C. through measurement of storage modulus/loss modulus of the filler using an advanced rheological expansion system (ARES, TA Co., Ltd). The filler specimens were laminated to a thickness of 400 μm, followed by cutting using a circle knife, thereby obtaining a sample having a diameter of 8.0 mm±0.1 mm. The sample was heated at a rate of 10° C./min, followed by extracting inflection points of storage modulus (G') and loss modulus (G") of the sample at an angular frequency of 10 rad/s. The extracted inflection points were specified as the flow beginning temperature.

(5) Reliability of OLED: A filler (a thermally cured product of the adhesive film for fillers) laminated substrate was stacked on a substrate including a 2 mm×2 mm (width×length) OLED Green unit device thereon to encapsulate the device. Initial luminescence of the prepared unit device panel was checked. After the prepared unit device panel was left at 85° C. and 85% RH for 24 hours, luminescence of the panel was checked again.

TABLE 1

|   |    | Example 1 | Example 2 | Example 3 | Example 4 |
|---|----|-----------|-----------|-----------|-----------|
| A | A1 | 35 | 35 | 35 | 35 |
|   | A2 | 30 | 30 | 30 | 30 |
|   | A3 | 35 | 35 | 35 | 35 |
| B |    | 15 | 30 | 10 | 40 |
| C |    | 10 | 10 | 10 | 10 |
| D | D1 | — | — | — | — |
|   | D2 | — | — | — | — |
| Adhesive strength (gf/m²) | | 68 | 97 | 83 | 90 |
| Water vapor transmission rate (g/m² · day) | | 53 | 38 | 55 | 32 |
| Outgassing amount (ppm) | | Below 0.01 | Below 0.01 | Below 0.01 | Below 0.01 |
| Flow beginning temperature (° C.) | | 43 | 45 | 42 | 46 |
| Reliability of OLED | Initial state | FIG. 2 | FIG. 4 | FIG. 6 | FIG. 8 |
|  | After being left at 85° C. and 85% RH for 24 hours | FIG. 3 | FIG. 5 | FIG. 7 | FIG. 9 |

TABLE 2

|   |    | Comparative Example 1 | Comparative Example 2 | Comparative Example 3 | Comparative Example 4 |
|---|----|-----------|-----------|-----------|-----------|
| A | A1 | 35 | 35 | 35 | 35 |
|   | A2 | 30 | 30 | 30 | 30 |
|   | A3 | 35 | 35 | 35 | 35 |
| B |    | 15 | 15 | 5 | 45 |
| C |    | — | — | 10 | 10 |
| D | D1 | 10 | — | — | — |
|   | D2 | — | 10 | — | — |
| Adhesive strength (gf/m²) | | 60 | 55 | 40 | 50 |
| Water vapor transmission rate (g/m² · day) | | 61 | 65 | 90 | 99 |
| Outgassing amount (ppm) | | 4.2 | 8.3 | 3.0 | 2.0 |
| Flow beginning temperature (° C.) | | 42 | 42 | 41 | 45 |
| Reliability of OLED | Initial state | FIG. 10 | FIG. 12 | FIG. 14 | FIG. 16 |
|  | After being left at 85° C. and 85% RH for 24 hours | FIG. 11 | FIG. 13 | FIG. 15 | FIG. 17 |

As shown in Tables 1 and 2, it can be seen that the thermosetting composition for organic light emitting diode fillers according to the present invention exhibited high adhesive strength, low water vapor transmission rate, and low outgassing amount, thereby securing reliability of an OLED. Referring to FIGS. 2 to 9, it can be seen that the entire front surface of the organic light emitting diode having a square shape emitted light without occurrence of dark spots or non-luminescent areas. In addition, the organic light emitting diode remained luminescent even after being left at 85° C. and 85% RH for 24 hours, which means that the organic light emitting diode had high reliability.

On the contrary, it can be seen that the compositions of Comparative Examples 1 to 4 exhibited relatively low adhesive strength, high water vapor transmission rate, and high outgassing amount as compared with the present invention, and thus could not secure reliability of an OLED. In other words, referring to FIGS. 11, 13, 15 and 17, showing luminescence of each of the devices in Comparative Examples 1 to 4 after being left at 85° C. and 85% RH for 24 hours, for evaluation of reliability of an OLED, it can be seen that the square-shaped front surface of the organic light emitting diode only partially emitted light, and dark non-luminescent parts appeared at an edge of the square. Further, in some cases, dark spots were created even inside the square. This means that the organic light emitting diodes had low reliability.

It should be understood that various modifications, variations, and alterations can be made by those skilled in the art without departing from the spirit and scope of the present invention. Therefore, the scope of the invention should be limited only by the accompanying claims and equivalents thereof.

The invention claimed is:

1. A thermosetting composition for organic light emitting diode fillers, comprising:
    100 parts by weight of (A) an epoxy-based resin composed of (A1) an epoxy resin having a weight average molecular weight of about 200 g/mol or more to less than about 1,000 g/mol, (A2) an epoxy resin having a weight average molecular weight of about 1,000 g/mol or more to less than about 20,000 g/mol, and (A3) an epoxy resin having a weight average molecular weight of about 20,000 g/mol or more to less than about 100,000 g/mol, wherein the epoxy resin (A2) contains one epoxy group for each repeat unit of (A2) the epoxy resin;
    about 10 parts by weight to about 40 parts by weight of (B) flake fillers; and
    about 0.1 parts by weight to about 20 parts by weight of (C) a cyano group-containing imidazole curing agent.

2. The thermosetting composition according to claim 1, wherein the epoxy resin (A2) includes one or more of a cresol novolac epoxy resin, a biphenyl novolac epoxy resin, or a naphthalene novolac epoxy resin, each of which is a solid at 25° C.

3. The thermosetting composition according to claim 1, wherein the epoxy resin (A2) has a glass transition temperature of about 30° C. to 70° C.

4. The thermosetting composition according to claim 1, wherein the epoxy resin (A2) is present in an amount of about 20 parts by weight to about 50 parts by weight based on 100 parts by weight of the epoxy resin (A1) and the epoxy resin (A3).

5. The thermosetting composition according to claim 1, wherein the epoxy resin (A2) is present in an amount of about 10 wt % to 40 wt % in the epoxy-based resin (A).

6. The thermosetting composition according to claim 1, wherein the epoxy resin (A2) is present in an amount of about 15 wt % to about 30 wt % in the thermosetting composition in terms of solid content.

7. The thermosetting composition according to claim 1, wherein the epoxy resin (A1) includes one or more of a bisphenol A epoxy resin, a bisphenol F epoxy resin, a hydrogenated bisphenol epoxy resin, a cycloaliphatic an epoxy resin, a naphthalene epoxy resin, a dicyclopentadiene epoxy resin, or a biphenyl epoxy resin, each of which is a liquid at 25° C.

8. The thermosetting composition according to claim 1, wherein the epoxy resin (A3) includes one or more of a bisphenol A epoxy resin, a bisphenol F epoxy resin, a phenoxy resin, a dicyclopentadiene epoxy resin, or a biphenyl epoxy resin, each of which is a solid at 25° C.

9. The thermosetting composition according to claim 1, wherein the flake fillers include talc.

10. The thermosetting composition according to claim 1, wherein the imidazole curing agent has a melting point of about 90° C. to about 250° C.

11. The thermosetting composition according to claim 1, wherein the imidazole curing agent includes one or more of 1-cyanoethyl-2-phenylimidazole, 1-cyanoethyl-2-undecylimidazolium-trimellitate, or 1-cyanoethyl-2-phenylimidazolium-trimellitate.

12. The thermosetting composition according to claim 1, wherein a thermally cured product of the thermosetting composition has an adhesive strength to a glass substrate of about 65 gf/m$^2$ to about 100 gf/m$^2$.

13. The thermosetting composition according to claim 1, wherein the thermosetting composition has a flow beginning temperature of higher than about 25° C. and less than 50° C.

14. An organic light emitting diode display comprising a thermally cured product of a thermosetting composition for organic light emitting diode fillers including:
   100 parts by weight of (A) an epoxy-based resin composed of (A1) an epoxy resin having a weight average molecular weight of about 200 g/mol or more to less than about 1,000 g/mol, (A2) an epoxy resin having a weight average molecular weight of about 1,000 g/mol or more to less than about 20,000 g/mol, and (A3) an epoxy resin having a weight average molecular weight of about 20,000 g/mol or more to less than about 100,000 g/mol;
   about 10 parts by weight to about 40 parts by weight of (B) flake fillers; and
   about 0.1 parts by weight to about 20 parts by weight of (C) a cyano group-containing imidazole curing agent.

* * * * *